United States Patent
Yusa et al.

(10) Patent No.: US 6,599,667 B2
(45) Date of Patent: Jul. 29, 2003

(54) HALFTONE PHASE SHIFT PHOTOMASK AND BLANK FOR HALFTONE PHASE SHIFT PHOTOMASK

(75) Inventors: Satoshi Yusa, Tokyo-to (JP); Toshifumi Yokoyama, Tokyo-to (JP); Shigeki Sumida, Tokyo-to (JP); Toshiaki Motonaga, Tokyo-to (JP); Yoshinori Kinase, Tokyo-to (JP); Hiro-o Nakagawa, Tokyo-to (JP); Chiaki Hatsuta, Tokyo-to (JP); Junji Fujikawa, Tokyo-to (JP); Masashi Ohtsuki, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 22 days.

(21) Appl. No.: 09/843,309

(22) Filed: Apr. 26, 2001

(65) Prior Publication Data

US 2002/0039689 A1 Apr. 4, 2002

(30) Foreign Application Priority Data

Apr. 27, 2000 (JP) ..................... P2000-127548

(51) Int. Cl.[7] ................................. G03F 9/00
(52) U.S. Cl. ........................................... 430/5
(58) Field of Search ................. 430/5, 322, 323, 430/324; 216/72

(56) References Cited

U.S. PATENT DOCUMENTS

| | | | |
|---|---|---|---|
| 4,890,309 A | 12/1989 | Smith et al. | 430/5 |
| 5,474,864 A | 12/1995 | Isao et al. | 430/5 |
| 5,482,799 A | 1/1996 | Isao et al. | 430/5 |
| 5,935,735 A | * 8/1999 | Okubo et al. | 430/5 |
| 6,037,083 A | 3/2000 | Mitsui | 430/5 |

FOREIGN PATENT DOCUMENTS

| | | |
|---|---|---|
| EP | 0090924 | 12/1983 |
| EP | 0838726 | 4/1998 |
| JP | 4136854 | 5/1992 |
| JP | 5002259 | 1/1993 |
| JP | 5127361 | 5/1993 |
| JP | 6083027 | 3/1994 |
| JP | 6308713 | 11/1994 |
| JP | 6332152 | 12/1994 |
| JP | 7005676 | 1/1995 |
| JP | 7028224 | 1/1995 |
| JP | 7110572 | 4/1995 |
| JP | 7134396 | 5/1995 |
| JP | 7281414 | 10/1995 |

* cited by examiner

*Primary Examiner*—S. Rosasco
(74) *Attorney, Agent, or Firm*—Lada & Parry

(57) ABSTRACT

A blank for halftone phase shift photomask is disclosed. The blank has a transparent substrate, a halftone phase shift layer and a light shielding film, the halftone phase shift layer and the light shielding film being layered in this order on the transparent substrate, and the l light shielding film is a single layered or multiple layered film which has a layer of tantalum.

10 Claims, 7 Drawing Sheets

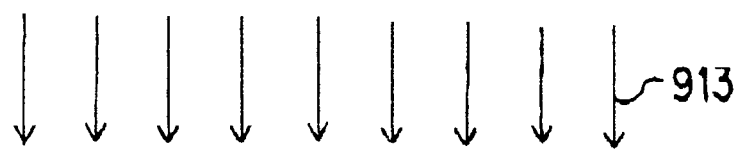
FIG.8A
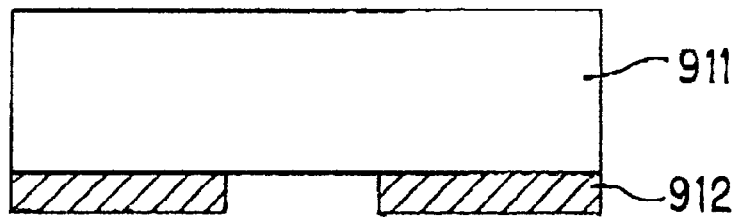
FIG.8B
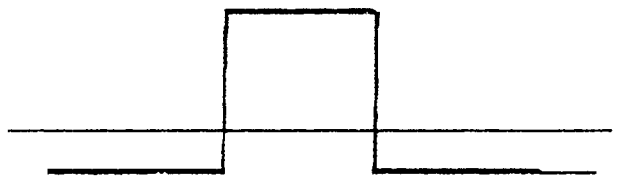
FIG.8C
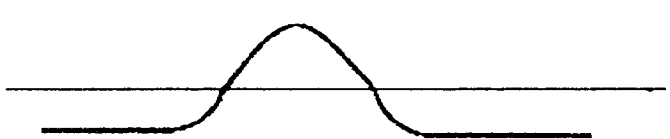
FIG.8D

HALFTONE PHASE SHIFT PHOTOMASK AND BLANK FOR HALFTONE PHASE SHIFT PHOTOMASK

BACKGROUND OF THE INVENTION

1. Field of the Invention

The present invention relates to a photomask used in manufacturing high density integrated circuits and the like, including LST and VLSI, and to a blank for a photomask for manufacturing the photomask, and particularly relates to a halftone phase shift photomask in which a projected picture in minute dimensions can be obtained and a blank for a halftone phase shift photomask to facilitate the manufacture of the phase shift photomask.

2. Description of the Related Art

Semiconductor integrated circuits such as IC, LSI and VLSI are manufactured by repeating a lithography process using a photomask. Particularly, the use of a phase shift photomask as shown in, for example, EP 0 090 924A2 (JP-A-58-173744, JP-B-62-59296) has been considered in order to form a circuit with minute dimensions.

Various kinds constructions have been proposed as the phase shift photomask. Particularly, in view of the possibility of practical use in early stage, halftone phase shift photomasks such as shown in, for example, JP-A-4-136854, U.S. Pat. No. 4,890,309 has been widely noticed.

Further, as disclosed in JP-A-5-2259, and JP-A-5-127361, some proposals have been made for construction and materials for increasing the yield and cost reductions may result by virtue of the reduced number of steps in the manufacturing processes.

As described below in detail, the halftone phase shift photomask comprises a transparent substrate, a halftone phase shift film, and optionally a light shading film.

In a halftone phase shift lithography, an area would be caused where the adjoining shots (transferring ranges by each exposure) on a wafer overlap each other when the "step-and-repeat" exposure, using equipment such as a stepper or scanner, is performed. Since the remaining pattern parts, differing from a conventional chromium mask, are also semitransparent, the overlapped areas are exposed to light by repeating multiple exposures.

Further, in a halftone phase shift lithography, there was a problem such that a subpeak in light intensity might occur in the neighborhood of an exposure pattern to be transferred when a wafer was exposed, and thus the subpeak may deform the exposure pattern predefined.

This problem is remarkable especially in the neighborhood of a large come-off pattern. Consequently, in a large come-off pattern which can be sufficiently resolved without using a phase shift lithography technique, its transferring property is rather inferior to a conventional type of using chromium mask.

For solutions to these problems, a halftone phase shift lithography method is generally adopted in transferring to a wafer, in which a halftone phase shift mask is used where a halftone phase shift film and a light shading film (which involves films of giving substantially complete light shading and film by which high contrast can be obtained, hereafter also referred to as a "light shading layer" or a "substantial light shading film"), both of which being patterned with the predetermined pattern, are layered onto the substrate in this order.

A halftone phase shift mask having such a light shading film is manufactured by using a blank where a halftone phase shift film and a light shading film are layered in this order onto a transparent substrate, and patterning the light shading film, separately from the patterning of a halftone phase shift film.

In the following, the conventional and typical manufacturing method of a halftone phase shift mask having the light shading film will be briefly explained.

First, on a blank in which a halftone phase shift film and a light shading film has been layered in this order on a transparent substrate in advance, a desired first resist pattern is formed by using the conventional lithography technique. Then, by using the first resist pattern as an anti-etching mask, both of a halftone phase shift pattern and a light shading film pattern are etched in a first etching step where the light shading film and the halftone phase shift film are etched sequentially in this order.

After the first etching step, following the removal of the first resist pattern and the rinsing of the substrate, a second resist pattern is further formed by using the conventional lithography technique. Then, a second etching step is performed, wherein only the light shading film is etched and patterned by using the second resist pattern as another anti-etching mask in order to form the light shading film pattern.

In the first etching step, the whole pattern to be formed on the mask are formed, and in the second etching step, a pattern is formed so that a light shading film is removed only in an area where a halftone phase shift effect is required.

As materials for the halftone phase shift film, for the purpose of possessing good characteristics with respect to the film forming property, patterning property, chemical stability after patterning, and durability, various kinds of materials, for example, an oxide film or nitride film of tantalum as disclosed in JP-A-7-134396 and JP-A-7-281414, films of metal silicide based materials including tantalum silicide based materials as disclosed in JP-A-6-83027 and molybdenum silicide based materials as disclosed in JP-A-6-332152, U.S. Pat. No. 5,474,864 (JP-A-7-140635) and U.S. Pat. No. 5,482,799 (JP-A-7-168343), films of chromium based materials as disclosed in JP-A-7-5676, JP-A-6-308713, JP-A-7-28224 and JP-A-7-110572, have been proposed and already put into use commercially.

On the other hand, as material for the light shading films (films providing substantially complete light shielding or film of giving films providing high contrast), films of chromium based materials have been used in view of their film forming properties, processability, film stability and the like.

For shaping the halftone phase shift film, the dry etching technique may be generally used. The dry etching technique can be roughly divided into two types, i.e., chlorine types and fluorine types. In actual use, owing to the kind of materials used for the film, one type would be selected promptly and thus it is necessary to know how to use them properly.

When the halftone phase shift film is formed with a material of chromium based film, chlorine dry etching is used. Whereas, the fluorine dry etching is usually used when the halftone phase shift film is formed with one of metal silicide based materials including tantalum silicide and molybdenum silicide, or formed with tantalum based materials, although the chlorine dry etching may be used in some cases.

Next, chromium based materials which are used as the light shading films have to be dry etched by a chlorine based gas. Therefore, when using one etching chamber, the fluorine dry etching for a silicide used as the halftone phase shift film should be followed by a gas replacing operation in the course of the aforementioned first etching step, which can be observed in the conventional and typical manufacturing method of the halftone phase shift mask having the aforementioned light shading film, and which results in complexities of the process and the etching apparatus's construction as well as troublesome operations.

By using two etching chambers, it would be possible to modify the first etching step so that the dry etching of the light shading film in an etching chamber is followed by the transfer of the treated substrate from the chamber to another chamber in order to dry-etch the silicide in the latter chamber. That is, it is possible to take such a way that the first etching step is discontinued in its course so as to transfer the substrate to the next chamber. However, the way also results in complexity of the etching apparatus's construction, and an enhancement in cost.

SUMMARY OF THE INVENTION

As described above, with respect to a halftone phase shift mask, it has been desired that a light shading film (a film of giving substantially complete light shading or film by which high contrast is obtained) and a halftone phase shift film can be dry-etched with using a gas, or gases of the same type regardless of the material types of the halftone phase shift film.

Accordingly, the present invention is aimed at providing a new halftone phase shift photomask. Further, the present invention is aimed at a halftone phase shift photomask having a constitution such that a dry etching process can be carried out without using a complex process and complex constitution in an etching equipment. Further more, the present invention is aimed at providing a blank for a halftone phase shift photomask which will make such a processing possible.

A blank for a halftone phase shift photomask according to the present invention is a blank for forming a halftone phase shift photomask and which comprises a transparent substrate, a halftone phase shift layer and a substantial light shielding film, the halftone phase shift layer and the substantial light shielding film being layered on the transparent substrate, and the substantial light shielding film being a single layered or multiple layered film which has a layer containing tantalum as a main ingredient.

In an embodiment of the blank according to the present invention, the halftone phase shift layer is a single layered or multiple layered film which has a layer containing a metal silicide as a main component and further containing element(s) selected from the group consisting of oxygen, nitrogen and fluorine. In a preferred embodiment of the present invention, the metal silicide is tantalum silicide.

In another embodiment of the blank according to the present invention, the halftone phase shift layer is a single layered or multiple layered film which has a layer containing chromium as a main component and further containing element(s) selected from the group consisting of oxygen, nitrogen and fluorine.

In still other embodiment of the blank according to the present invention, the halftone phase shift layer is formed on the transparent substrate so as to have a phase difference $\phi$ within the range of $n\pi \pm \pi/3$ radian (n is an odd number), the phase difference $\phi$ being calculated from the following equation:

$$\phi = \sum_{k=1}^{m-1} \times (k, k+1) + \sum_{k=2}^{m-1} 2\pi(u(k)-1)d(k)/\lambda$$

wherein $\phi$ is a phase change caused to light vertically transmitting through the photomask in which a halftone phase shift layer having (m−2) layer(s) is disposed on the transparent substrate, $\times$(k, k+1) is a phase change occurring in the interface between a $k^{th}$ layer and a $(k+1)^{th}$ layer, u(k) and d(k) are the refractive index and film thickness of a material forming the $k^{th}$ layer, respectively, and $\lambda$ is the wavelength of exposure light, providing that the layer of k=1 is the transparent substrate and the layer of k=m is air.

In another embodiment of the blank according to the present invention, the halftone phase shift layer is formed on the transparent substrate so as to have a film thickness with the transmittance of exposure light within the range of 1 to 50% when the transmittance of exposure light of the transparent substrate is defined as 100%.

The halftone phase shift photomask of the present invention is a halftone phase shift photomask which comprises a transparent substrate, a halftone phase shift layer and a substantial light shielding film, the halftone phase shift layer and the substantial light shielding film being layered on a transparent substrate, and the substantial light shielding film being a single layered or multiple layered film which has a layer containing tantalum as a main ingredient.

In an embodiment of the halftone phase shift photomask according to the present invention, the halftone phase shift layer is a single layered or multiple layered film which has a layer containing a metal silicide as a main component and further containing element(s) selected from the group consisting of oxygen, nitrogen and fluorine. In a preferred embodiment of the present invention, the metal silicide is tantalum silicide.

In another embodiment of halftone phase shift photomask according to the present invention, the halftone phase shift layer is a single layered or multiple layered film which has a layer containing chromium as a main component and further containing element(s) selected from the group consisting of oxygen, nitrogen and fluorine.

Instill other embodiment of halftone phase shift photomask according to the present invention, the halftone phase shift layer is formed on the transparent substrate so as to have a phase difference $\phi$ within the range of $n\pi \pm \pi/3$ radian (n is an odd number), the phase differences being calculated from the following equation:

$$\phi = \sum_{k=1}^{m-1} \times (k, k+1) + \sum_{k=2}^{m-1} 2\pi(u(k)-1)d(k)/\lambda$$

wherein $\phi$ is a phase change caused to light vertically transmitting through the photomask in which a halftone phase shift layer having (m−2) layer(s) is disposed on the transparent substrate, $\times$(k, k+1) is a phase change occurring in the interface between a $k^{th}$ layer and a $(k+1)^{th}$ layer, u(k) and d(k) are the refractive index and film thickness of a material forming the $k^{th}$ layer, respectively, and $\lambda$ is the wavelength of exposure light, providing that the layer of k=1 is the transparent substrate and the layer of k=m is air.

In another embodiment of the halftone phase shift photomask according to the present invention, the halftone phase shift layer is formed on the transparent substrate so as to have a film thickness with the transmittance of exposure light within the range of 1 to 50% when the transmittance of exposure light of the transparent substrate is defined as 100%.

The blank for halftone phase shift photomask according to the present invention, because of having thus constitution, can provides the halftone phase shift photomask by using dry etching without complicating the etching process and the etching apparatus.

The halftone phase shift photomask according to the present invention, also can be manufactured by using dry etching without complicating the etching process and the etching apparatus.

BRIEF DESCRIPTION OF THE DRAWINGS

FIGS. 8A to 8D are views to explain a halftone phase shift method.

DETAILED DESCRIPTION OF THE PREFERRED EMBODIMENTS

In advance of giving a full account of the characteristics of the blank for halftone phase shift photomask and the photomask obtained therefrom according to the present invention, we will explain the generic contents of the halftone phase shift method and a halftone phase shift photomask briefly. It would be helpful in the skilled persons' understanding of this invention.

FIG. 8 shows the principle of a halftone phase shift method and FIG. 9 shows a conventional method.

Figure 9A:
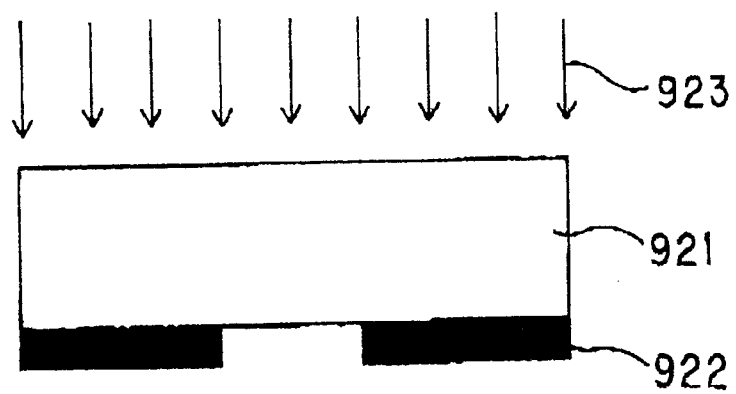
FIGS. 9A to 9D are views to explain a transcription method (a projection exposure method) using a mask in a conventional method.
Figure 9B:
Figure 9C:
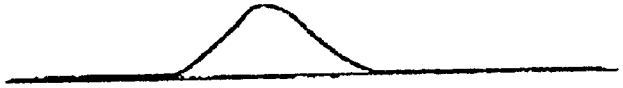
Figure 9D:

FIG. 8A and FIG. 9A are sectional views of a photomask, FIG. 8B and FIG. 9B show amplitudes of light on the photomask, FIG. 8C and FIG. 9C show amplitudes of light on a wafer, and FIG. 8D and FIG. 9D show light intensity on the wafer, respectively. In addition, 911 and 912 denote substrates, 922 denotes a 100% light-shielding fil, 912 denotes a halftone phase shift film in which the phase of incident light is shifted by 180 degrees substantially and the light transmittance thereof is within the range of 1 to 50%, and 913 and 923 denote incident light.

In the conventional method, as shown in FIG. 9A, a light transmitting portion is prepared only by forming a 100% light-shielding film 922 made of chromium or the like on a substrate 921 made of quartz glass or the like, and then patterning to the desired pattern. Thus, the distribution of light intensity on the wafer is widened toward the end as shown in FIG. 9D, resulting in lowering resolution.

On the other hand, in the halftone phase shift method, because the phase of light transmitted through a halftone phase shift film 912 and that of light passed through an aperture thereof are substantially inverse each other, light intensity becomes to be 0 at the interface part of the pattern on the wafer as shown in FIG. 8D, which can prevent the distribution of light intensity from spreading toward the end, thus resulting in improving resolution.

The halftone phase shift film 912 of the halftone phase shift photomask, therefore, would be required to have two functions, i.e., the phase inversion and the transmittance controlling.

Concerning the phase inversion function, it is sufficient that the phase of exposure light transmitting through a halftone phase shift film 912 and that of exposure light passed through the aperture thereof are substantially inverse each other.

Here, when a halftone phase shift film (also referred as a halftone phase shift layer) 912 is considered, for example, as an absorption film shown in "Principles of Optics" by M. Born and E. Wolf, pp. 628 to 632, the multiple interference can be ignored. Thus, a phase change φ of vertically transmitting light is calculated by the following equation. When φ is within the range of nπ±π/3 radian (n is an odd number), the above-mentioned phase shift effect can be obtained.

$$\phi = \sum_{k=1}^{m-1} \times (k, k+1) + \sum_{k=2}^{m-1} 2\pi(u(k)-1)d(k)/\lambda$$

wherein φ is a phase change caused to light vertically transmitting through the photomask in which a halftone phase shift layer with (m−2) layers is disposed on the transparent substrate, ×(k, k+1) is a phase change occurring in the interface between a $k^{th}$ layer and a $(k+1)^{th}$ layer, u(k) and d(k) are the refractive index and film thickness of a material forming the $k^{th}$ layer, respectively, and λ is the wavelength of exposure light, providing that the layer of k=1 is the transparent substrate and the layer of k=m is air.

On the other hand, the transmittance of exposure light through the halftone phase shift film 912 to make the halftone phase shift effect would be modulated with the varying patterns, with respect to the dimensions, areas, arrangements, shapes and the like of the transcription patterns.

In order to obtain substantially the above-mentioned effect, the transmittance of exposure light through the half tone phase shift film 912 must be set within the range of the optimum transmittance±several percents, which optimum transmittance is determined by the pattern itself.

Usually, this optimum transmittance greatly varies within the wide range of 1 to 50% with transcription patterns when the transmittance at apertures is defined as 100%.

That is, in order to answer to all patterns, half tone phase shift photomasks having various values in transmittance are required.

Practically the phase inversion function and transmittance controlling function are decided by the complex refractive index (refractive index and extinction coefficient) and film thickness of a material for the half tone phase shift film (in case of a multilayer, of each material composing each layer).

That is, a material that can have a phase difference φ within the range of nπ±π/3 radian (n is an odd number) according to the expression mentioned above when controlling the thickness of the half tone phase shift film can be used as a half tone phase shift layer of a halftone phase shift photomask.

Now, this invention will be described in detail with reference to preferred embodiments.

The blank for forming a halftone phase shift photomask according to this invention has a halftone phase shift layer and a substantial light shielding film, both of which are layered on a transparent substrate, and the substantial light shielding film is a single layered or multiple layered film which has a layer containing tantalum as a main ingredient, more preferably, the halftone phase shift layer is a single layered or multiple layered film which has a layer containing a metal silicide as a main component and further containing element(s) selected from the group consisting of oxygen, nitrogen and fluorine.

Thus, for example, in case that the substantial light shielding film is prepared with a layer containing tantalum as a main component and a chromium oxide layer as an anti-reflective layer superposed on the tantalum containing layer (the outer surface side), and a chromium based material is used as the halftone phase shift film, the etching both of the substantial light shielding film and the halftone phase shift film can be attained by dry etching with a chlorine based gas.

Alternatively, in cases that the substantial light shielding film is prepared with a single layer or multilayer containing tantalum as a main component, and as the halftone phase shift film, a film of metal silicide based material such as tantalum silicide based material and molybdenum silicide based material, and a film of tantalum based materials is used in a single layer or multilayer, the etching both of the substantial light shielding film and the halftone phase shift film can be carried out by dry etching with a fluorine based gas.

When the light shielding film is prepared by using tantalum, or the materials containing tantalum as a main component such as tantalum oxide, tantalum nitride, tantalum oxynitride and etc., the etching of the light shielding film can be attained by both of dry etching using chlorine based gases such as $Cl_2$ and $CH_2Cl_2$, and dry etching using fluorine based gases such as $CF_4$, $SF_6$ and $CHF_3$.

Furthermore, as a light shielding film, if metal tantalum and tantalum oxide are layered in the order from the side of the substrate, it is possible to realize low reflection of exposure light by controlling the refractive index and film thickness of tantalum oxide film.

The "substantial shading film" used herein involves films of giving high contrasts as well as films of giving substantially complete light shielding. Namely, the least the substantial shading film has a light shielding ability of higher than that of the halftone phase shift layer, and the light shielding ability of the shading film can inhibit effectively the reaction of resist due to exposing the light.

With respect to the refractive index of the film of a tantalum based material, it can be controlled by the oxidation degree of the film and also by nitriding or oxynitriding the film.

Moreover, the refractive index of the tantalum based film can also be controlled by adding any atoms other than oxygen and nitrogen as necessary, and it is easy to realize substantially low reflection to the incidence of a beam with wavelength of exposure light.

Further, the tantalum based film according to this invention may have as unavoidable impurities, elements such as Fe, Nb, Si, Y, Ce, etc.

As the film containing tantalum as a main ingredient according to this invention, the composition thereof is not particularly limited as far as it can be dry-etched by the chlorine based gases and/or fluorine based gases as mentioned above.

Such a tantalum film or its oxide film, nitride film and the like can be easily formed by the sputtering method that has been conventionally used for making a raw material film for a photomask.

For example, in case that tantalum metal is used as a target and the sputtering method is carried out with only an argon gas, a tantalum metal film can be obtained, and when oxygen or nitrogen is added to the sputtering gas, a tantalum oxide film or a tantalum nitride film can be obtained.

The adjustment of the refractive index as mentioned above can be controlled by the sputtering pressure, the sputtering current and the like, as well as the mixing ratio of gases.

Furthermore, this film of a tantalum based material can also be made by adapting any film preparation techniques other than the sputtering method, which include, for example, vacuum deposition, CVD, ion plating and ion beam sputtering.

As one layer of the halftone phase shift film according to one embodiment of the present invention, the layer containing a metal silicide as a main component and further containing element(s) selected from the group consisting of oxygen, nitrogen and fluorine, is not particularly limited with respect to the composition thereof, as far as it can function with the desired properties. As another embodiment of the layer, the layer containing chromium as a main component and further containing element(s) selected from the group consisting of oxygen, nitrogen and fluorine, is also not particularly limited with respect to the composition thereof.

As some preferable examples of the halftone phase shift layer of these types, those disclosed in commonly owned and co-pending U.S. Pat. No. 6,458,496 (EP patent application No. 311226.5 and JP patent applications Nos. 11-355522 (1999) and 2000-154687) are cited, but these are examples and the disclosure therein is to be considered as not limited thereto. The description of the related parts in U.S. Pat. No. 6,458,496 is incorporated herein by reference.

Next, referring to some preferred embodiments illustrated in Figures, this invention will be described in details.

Figure 1:
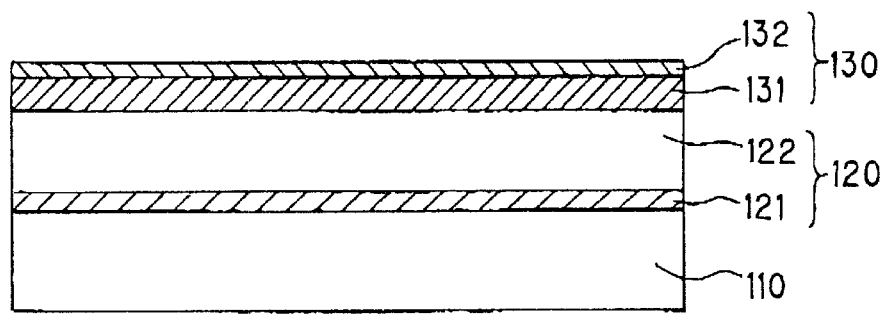
FIG. 1 is a sectional view of a first embodiment of a blank for halftone phase shift photomask according to the present invention.
Figure 2:
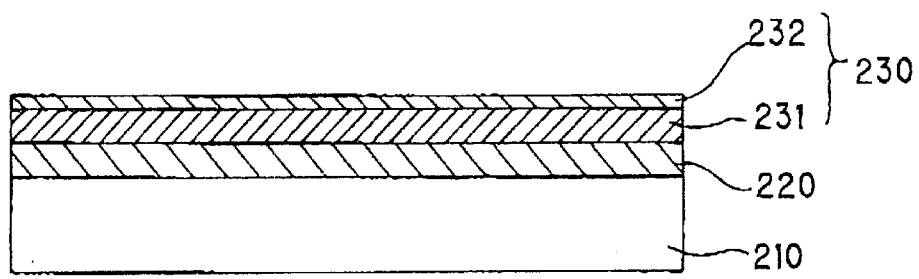
FIG. 2 is a sectional view of a second embodiment of the blank for halftone phase shift photomask according to the present invention.
Figure 3:
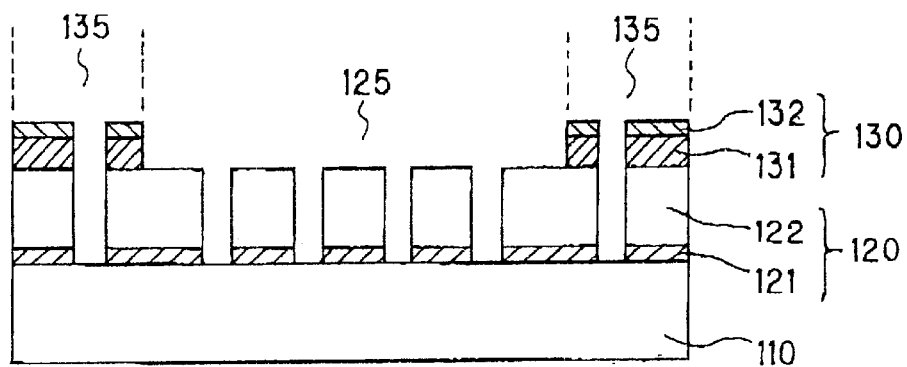
FIG. 3 is a sectional view of a first embodiment of a halftone phase shift photomask according to the present invention.
Figure 4:
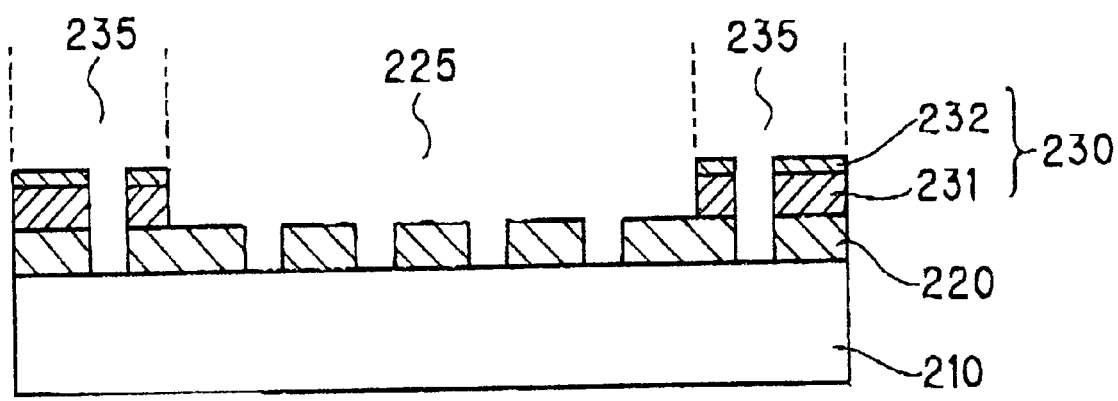
FIG. 4 is a sectional view of a second embodiment of the halftone phase shift photomask according to the present invention.
Figure 5A:
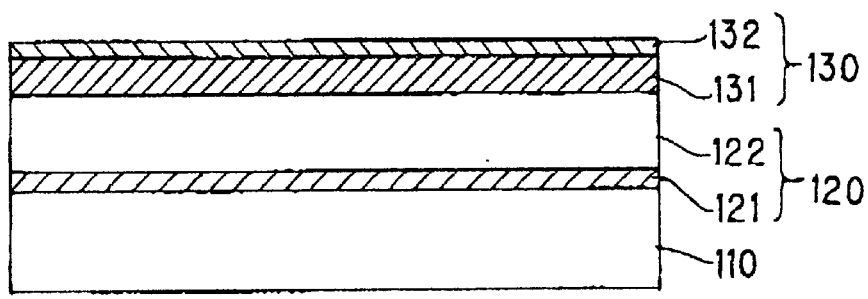
FIGS. 5A to 5E are sectional views of a manufacturing process of a halftone phase shift photomask of the first embodiment illustrated in FIG. 3.
Figure 5B:
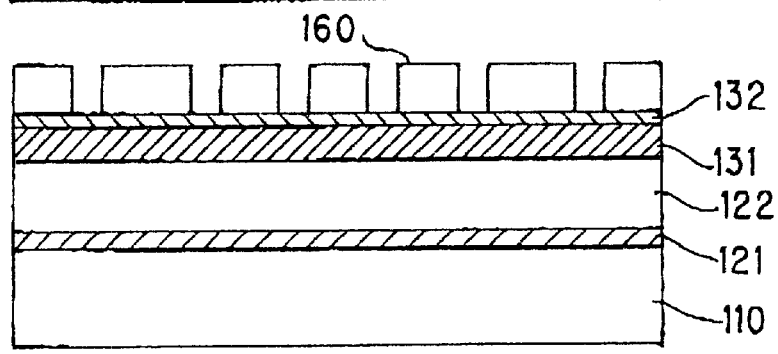
Figure 5C:
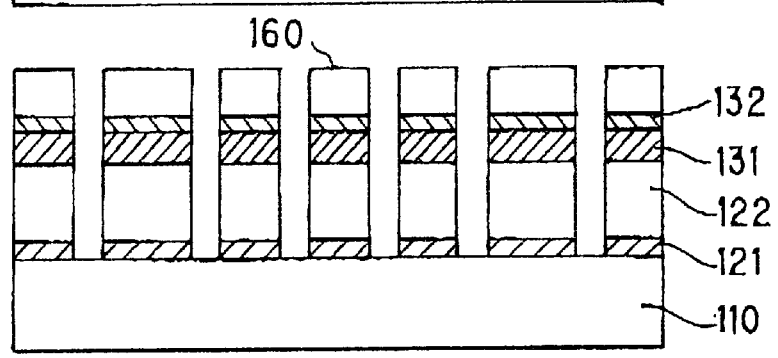
Figure 5D:
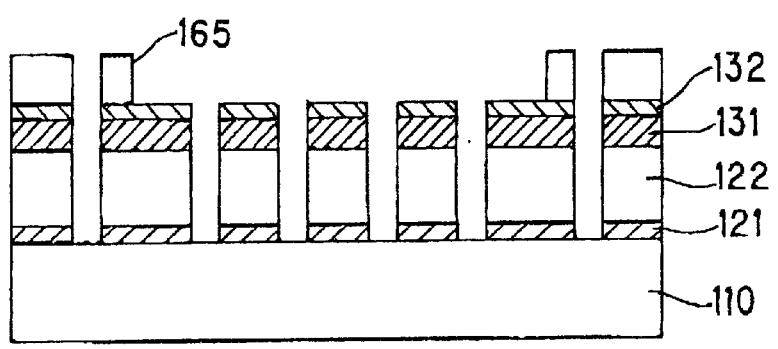
Figure 5E:
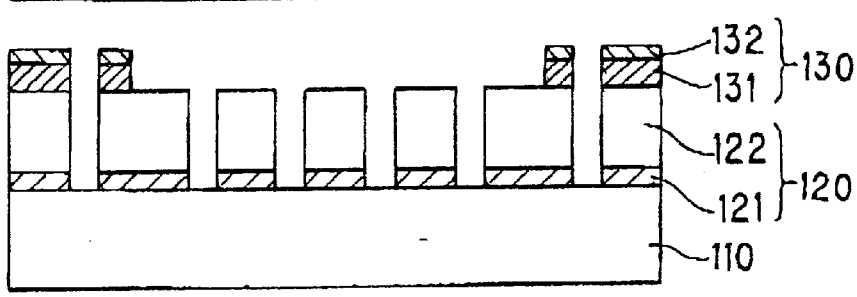
Figure 6A:
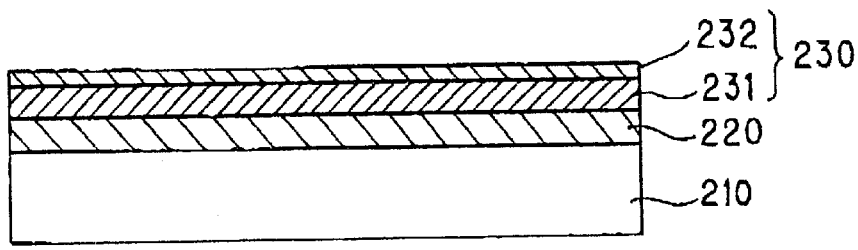
FIGS. 6A to 6E are sectional views of the manufacturing process of a halftone phase shift photomask of the second embodiment illustrated in FIG. 4.
Figure 6B:
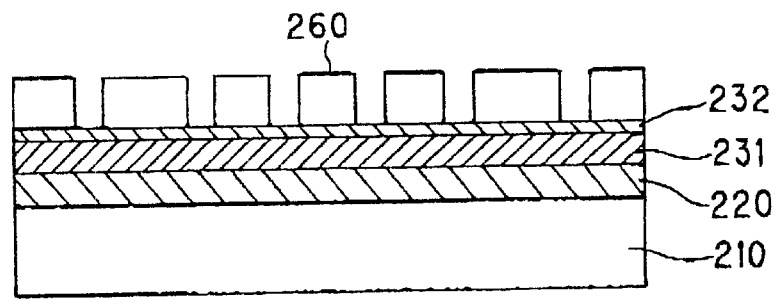
Figure 6C:
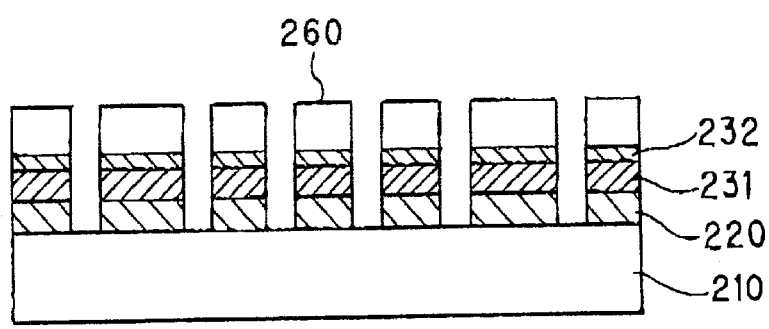
Figure 6D:
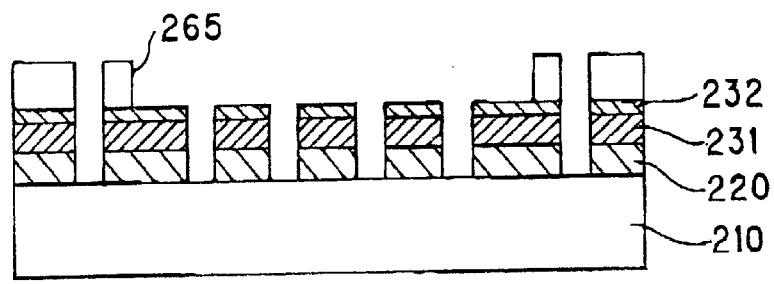
Figure 6E:
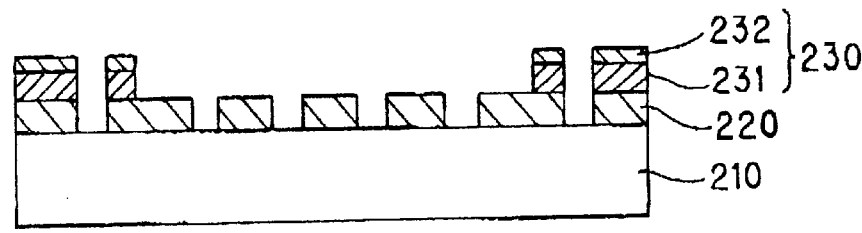
Figure 7A:
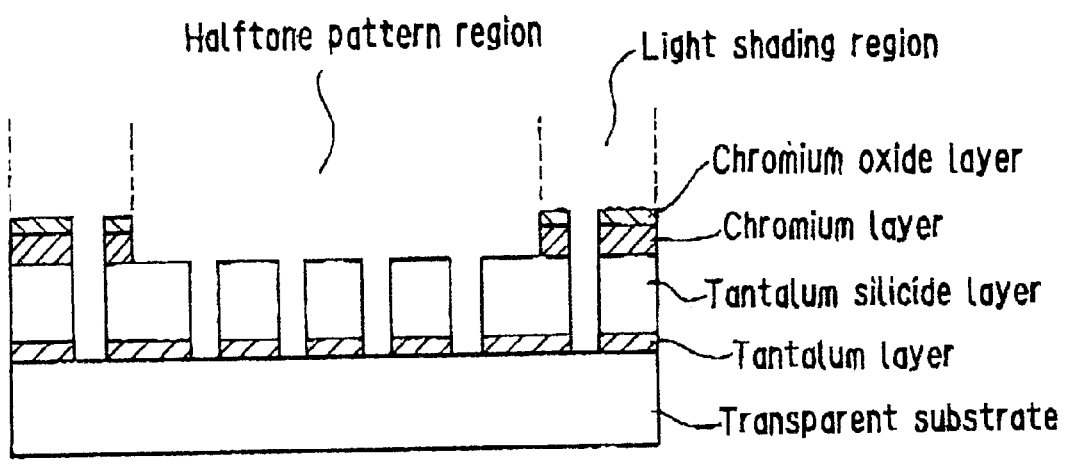
FIG. 7A is a sectional view of a halftone phase shift photomask of a comparative example.
Figure 7B:
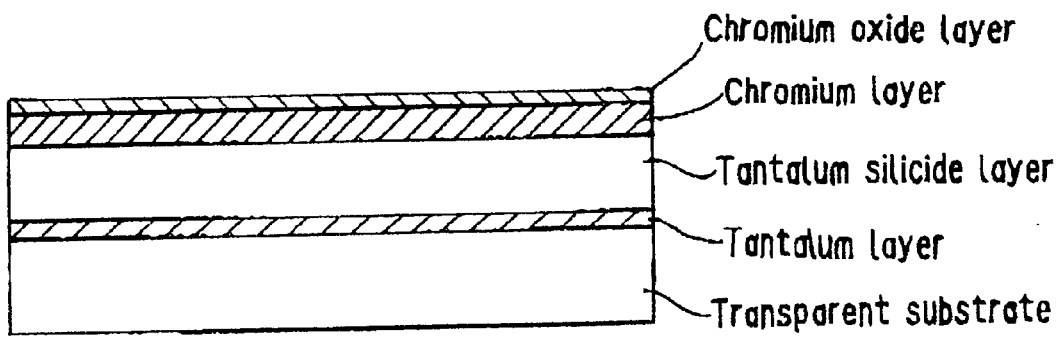
FIG. 7B is a sectional view of a blank for a halftone phase shift photomask of a comparative example.

FIG. 1 is a sectional view of a blank for a halftone phase shift photomask in a first example of the embodiment of the present invention, FIG. 2 is a sectional view of a blank for a halftone phase shift photomask in a second example of the embodiment, FIG. 3 is a sectional view of a halftone phase shift photomask in a first example of the embodiment, FIG. 4 is a sectional view of a halftone phase shift photomask in a second example of the embodiment, FIGS. 5A to 5E are sectional views illustrating the manufacturing process of a halftone phase shift photomask in the first example shown in FIG. 3, FIGS. 6A to 6E are sectional views illustrating the manufacturing process of a halftone phase shift photomask in the second example shown in FIG. 4, FIG. 7A is a sectional view of a halftone phase shift photomask in a comparative example, and FIG. 7B is a sectional view of a blank for a halftone phase shift photomask in the comparative example.

In FIG. 1, 110 is a transparent substrate, 120 is a halftone phase shift layer, 121 is a tantalum layer, 122 is a metal oxysilicide film (a tantalum oxysilicide film), 125 is a halftone pattern area (a pattern area in a shift layer), 130 is a light shading layer (also called a substantial light shielding film), 131 is a tantalum layer, 132 is tantalum oxide (an antireflection layer and can also be written as TaOx), 135 is a pattern area in a light shading layer, 160 and 165 are resist layers, 210 is a transparent substrate, 220 is a chromium oxide layer (a halftone phase shift layer), 225 is a halftone pattern area (a pattern area in a shift layer), 230 is a light shading layer (also called a substantial light shielding film), 231 is a tantalum layer, 232 is a tantalum oxide layer (an antireflection layer and can also be written as TaOx), 235 is alight shading pattern area, and 260 and 265 are resist layers.

First Embodiment of Blank for a Halftone Phase Shift Photomask

In the beginning, the first embodiment of a blank for a halftone phase shift photomask of the present invention will be explained as referred to FIG. 1.

This embodiment is a blank for forming a halftone phase shift photomask, in which blank a halftone phase shift layer 120 and a light shading layer (a substantial light shielding film) 130 are layered in the order on a transparent substrate 110, the light shading layer 130 is a two-layer film which comprises a tantalum layer 131 and a tantalum oxide layer 132, those layers being superposed on the transparent substrate 110 in this order, and the halftone phase shift layer 121 is a two-layer film which comprises a tantalum layer 121 and a metal oxysilicide film 122, those layers being superposed in this order from the side of the transparent substrate 110.

In this embodiment, both of the light shading layer 130 and the halftone phase shift layer 120 are composed of materials which can be dry etched with a fluorine type gas. Consequently, unlike the conventional manufacturing process as mentioned above, the first etching step in the manufacturing method of a halftone phase shift mask having a light shading film can be continuously carried out without being discontinued.

Further, because the metal oxysilicide film 122 in the halftone phase shift layer 120 is hardly etched with a chlorine type gas, the film can function as an etching stopper layer when the light shading layer 130 is dry etched with a chlorine type gas.

As the metal oxysilicide film 122, tantalum oxysilicide films, molybdenum oxysilicide films and others are usable. Among them, tantalum oxysilicide films are particularly preferable with respect to the rinsing-ability of photomasks, since rather than other types, tantalum oxysilicide films have an more excellent stability to acid, alkali and the like.

And, in order to obtain the phase shift effects when a halftone phase shift photomask is manufactured, the halftone phase shift layer 120 is formed on the transparent substrate 110 so as to have a phase difference φ within the range of nπ±π/3 radian (n is an odd number) when m is 4 in the following equation:

$$\phi = \sum_{k=1}^{3} \times (k, k+1) + \sum_{k=2}^{3} 2\pi(u(k)-1)d(k)/\lambda$$

wherein φ is a phase change caused to light vertically transmitting through the photomask in which the halftone phase shift layer 120 with (m−2) layers is disposed on the transparent substrate 110, ×(k, k+1) is a phase change occurring in the interface between a $k^{th}$ layer and a $(k+1)^{th}$ layer, u(k) and d(k) are the refractive index and film thickness of a material (the tantalum layer 121, the metal oxysilicide film 122) forming the $k^{th}$ layer, respectively, and λ is the wavelength of exposure light, providing that the layer of k=1 is the transparent substrate 110 and the layer of k=4 is air.

In addition, in order to obtain the phase shift effects substantially when a halftone phase shift photomask is manufactured, the halftone phase shift layer 120 is formed on the transparent substrate 110 so as to have a film thickness with the transmittance of exposure light within the range of 1 to 50% when the transmittance of exposure light of the transparent substrate 110 is defined as 100%.

All of the tantalum oxide layer 132, the tantalum layer 131, the tantalum oxysilicide film 122, and the tantalum layer 121 can be formed by the sputtering method that are well known in the art and has been used for making a thin film for a photomask.

When the metal tantalum is used as a target and the sputtering is performed only with an argon gas, a metal tantalum film can be formed, and when oxygen or nitrogen is added in the sputtering gas, a tantalum oxide film or a tantalum nitride film can be obtained.

Furthermore, this film of a tantalum based material can also be made using film preparation technologies other than the sputtering method, which include, vacuum deposition, CVD, ion plating and ion beam sputtering.

Similarly, regarding metal oxysilicide films, including a tantalum oxysilicide film and molybdenum oxysilicide film, when a metal oxysilicide film is used as a target and the sputtering is performed by using only an argon gas, a metal silicide film can be formed, and when oxygen or nitrogen is added in the sputtering gas, a metal oxysilicide film or a metal silicide nitride film can be obtained.

The adjustment of the refractive index of the metal oxysilicide film 122 can be controlled by the sputtering pressure, the sputtering current and the like, as well as the mixing ratio of gases.

Second Embodiment of Blank for a Halftone Phase Shift Photomask

Then, a second embodiment of a blank for a halftone phase shift photomask of the present invention will be explained as referred to FIG. 2.

This embodiment is a blank for forming a halftone phase shift photomask, in which a halftone phase shift layer 220 and a light shading layer 230 are layered in this order on a transparent substrate 210, the light shading layer 230 is a two-layer film which comprises a tantalum layer 231 and a tantalum oxide layer 232 being superposed in this order from the side of the transparent substrate 210, and the halftone phase shift layer 220 is a single layer film of chromium oxide layer.

In this embodiment, both of the light shading layer 230 and the halftone phase shift layer 220 are composed of materials which can be dry etched with a chlorine based gas. Consequently, similarly to the first embodiment, the first etching step in the manufacturing method of a halftone phase shift mask having a light shading film can be continuously carried out without being discontinued.

Further, the chromium oxide layer 220 that is a halftone phase shift layer is hardly dry etched with a fluorine based gas, and the layer thus is not etched when a light shading layer 230 is dry etched.

And, in order to obtain the phase shift effects when a halftone phase shift photomask is manufactured, the halftone phase shift layer 120 is formed on the transparent substrate 110 so as to have a phase difference φ within the range of nπ±π/3 radian (n is an odd number) when m is 3 in the following equation:

$$\phi = \sum_{k=1}^{2} \times (k, k+1) + 2\pi(u(2)-1)d(2)/\lambda$$

wherein φ is a phase change caused to light vertically transmitting through the photomask in which one layer of the halftone phase shift layer 220 is disposed on the transparent substrate 210, ×(k, k+1) is a phase change occurring in the interface between a $k^{th}$ layer and a $(k+1)^{th}$ layer, u(2) and d(2) are the refractive index and film thickness of a material forming the second layer (the chromium oxide layer 220), respectively, and λ is the wavelength of exposure light, providing that the layer of k=1 is the transparent substrate 210 and the layer of k=3 is air.

In addition, in order to obtain the phase shift effects substantially when a halftone phase shift photomask is manufactured, the halftone phase shift layer 220 is formed on the transparent substrate 210 so as to have a film thickness with the transmittance of exposure light within the range of 1 to 50% when the transmittance of exposure light of the transparent substrate 210 is defined as 100%.

The chromium oxide layer 220 can be formed by well-known sputtering methods that have been used for making a thin film for a photomask.

When the metal chromium is used as a target and the sputtering is performed only with an argon gas, a metal chromium film can be obtained, and when oxygen or nitrogen is added in the sputtering gas, a chromium oxide film or a chromium nitride film can be obtained.

The adjustment of the refractive index of the chromium oxide layer 220 can be controlled by the sputtering pressure, the sputtering current and the like, as well as the mixing ratio of gases.

Furthermore, this film of a chromium based material can also be made using film preparation technologies other than the sputtering method, which include, vacuum deposition, CVD, ion plating and ion beam sputtering.

Moreover, the tantalum layer 231 can be formed similarly to the tantalum layers 131 and 121 in the first embodiment.

Other Embodiments of Blank for a Halftone Phase Shift Photomask

As modifications of a blank for a halftone phase shift photomask of the first embodiment, light shading layers composed of a single layer or a multilayer of other materials which can be dry etched with both of a fluorine based gas and a chlorine based gas can be cited as a light shading layer 130.

Such a modification is, for example, a light shading layer that uses a single tantalum layer instead of the light shading layer 130 composed of the tantalum layer 131 and the tantalum oxide layer 132 in the first embodiment, or a light shading layer that uses a tantalum oxynitride layer or a molybdenum (Mo) layer instead of the tantalum layer 131 in the first embodiment.

And, in the first embodiment and the above-mentioned modification, as a constitution of a halftone phase shift layer, it is possible to cite a constitution in which one layer containing a metal silicide as a main component and further containing one or more element among oxygen, nitrogen and fluorine is layered as the uppermost layer, and one or more layers of other material which can be dry etched with a fluorine based gas are layered as lower layer(s), namely, the transparent substrate 210 side.

For example, it is possible to cite a constitution having a molybdenum layer instead of the tantalum layer 121 of the halftone phase shift layer 120 in the first embodiment and the above-mentioned modification.

Furthermore, instead of the tantalum or molybdenum oxysilicide film 122 in the first embodiment, silicide oxynitride films and silicide nitride films with other compositions of tantalum or molybdenum can be cited.

Moreover, a tantalum oxynitride layer, a molybdenum (Mo) layer, a metal silicide oxynitride films, and a silicide nitride film as mentioned above are also formed by the sputtering method using only argon as a sputtering gas or using a mixed gas in which a predetermined amount of oxygen or nitrogen is added to argon as a sputtering gas.

As modifications of a blank for a halftone phase shift photomask of the second embodiment, light shading layers composed of other materials which can be dry etched with both of a fluorine based gas and a chlorine based gas as a light shading layer 230.

Such a modification is, for example, a light shading layer that uses a tantalum oxynitride layer or a molybdenum (Mo) layer instead of the tantalum layer 131 in the second embodiment.

Further, in the second embodiment and the above-mentioned modification, as a halftone phase shift layer, layers composed of other materials that can be dry etched with a chlorine based gas but is hardly dry etched with a fluorine based gas can be cited.

For example, instead of the chromium oxide layer 220 in the second embodiment, chromium oxynitride films and chromium oxide films with other compositions can be cited.

As persons skilled in the arts, it can be easily understood that many other modifications or alternations of the above mentioned embodiments of the blank can be made within the scope and spirit of the present invention which are defined only by the annexed claims.

First Embodiment of Halftone Phase Shift Photomask

Next, the first embodiment of a halftone phase shift photomask of the present invention will be explained based on FIG. 3.

This embodiment is a halftone phase shift photomask that is manufactured using the blank of the first embodiment shown in FIG. 1, and in this embodiment, a halftone pattern area (a pattern area in a shift layer) 125 to obtain a phase shift effect and a light shading pattern area 135 to obtain a practical light shielding effect are prepared.

About the material and optical property of each layer, the explanation of the blank for a halftone phase shift photomask of the first embodiment shown in FIG. 1 will be substituted for. Further explanation will be omitted here.

Then, one instance of manufacturing methods of the halftone phase shift photomask in the first embodiment will be explained as referred to FIG. 5.

First, a blank for a halftone phase shift photomask of the first embodiment as shown in FIG. 1 is prepared (FIG. 5A), a resist layer 160 is formed on the light shading film 130 in accordance with the pattern shape of a halftone phase shift layer 120 to be made (FIG. 5B).

As the resist to form the resist layer 160, one which is easily treatable, and has a desirable resolution and a high dry etching resistance is preferable, but it is not limited thereto.

Next, with using the resist layer 160 as an anti-etching mask, the light shading layer 130 and then the halftone phase shift layer 120 are continuously etched by a fluorine based gas.

A halftone phase shift layer pattern with a light shading film 130 can be obtained herewith (FIG. 5C).

Moreover, if necessary, the composition of the fluorine based gas may be changed.

Then, after the resist layer 160 is peeled off by an ordinary method, a resist layer 165 having an aperture corresponding to the shape of a light shading film 130 to be made is formed on the light shading layer 130 (FIG. 5D), and with using this resist layer as an anti-etching mask, the light shading layer 130 is etched by a chlorine based gas.

The metal oxysilicide layer 122 serves as an etching stopper layer.

The resist layer 165 is, then, peeled off by an ordinary method to form a halftone phase shift photomask of the first embodiment (FIG. 5E).

As the resist to form the resist layer 165, one which is easily treatable, and has a desirable resolution and a high dry etching resistance is preferable, but it is not limited thereto.

As a modification of the halftone phase shift photomask of this embodiment, a phase shift photomask using a blank in each modification of the blank in the first embodiment shown in FIG. 1 mentioned previously can be cited.

These photomasks can be made by the manufacturing process shown in FIG. 5.

Second Embodiment of Halftone Phase Shift Photomask

Next, a second embodiment of the embodiment of the halftone phase shift photomask of the present invention will be explained based on FIG. 4.

This embodiment is a halftone phase shift photomask that is manufactured by using the blank for a halftone phase shift photomask in the second embodiment shown in FIG. 2, and in this embodiment, similarly to the blank of the first embodiment, a halftone pattern area (a shift layer pattern area) 225 to obtain a phase shift effect and a light shading pattern area 235 to obtain a practical light shielding effect are prepared.

About the material and optical property of each layer, the explanation of the blank for a halftone phase shift photomask of the second embodiment shown in FIG. 2 will be substituted for. Further explanation will be omitted here.

And as a modification of this embodiment, a phase shift photomask using a blank in the modifications of the blank in the second embodiment shown in FIG. 2 mentioned previously can be cited.

Then, one embodiment of the manufacturing methods of the halftone phase shift photomask in the second embodiment will be explained as referred to FIG. 6.

First, a blank for a halftone phase shift photomask of the first embodiment as shown in FIG. 2 is prepared (FIG. 6A), then a resist layer 260 is formed on the light shading film 230 of the blank, with having a pattern in accordance with the pattern shape of a halftone phase shift layer 220 to be made (FIG. 6B).

As the resist to form the resist layer 260, one which is easily treatable, and has a desirable resolution and a high dry etching resistance is preferable, but it is not limited thereto.

Next, with using the resist layer 260 as an anti-etching mask, the light shading layer 230 and then the halftone phase shift layer 220 are continuously etched by a chlorine based gas.

Thus, the halftone phase shift layer pattern with a light shading film 230 can be obtained (FIG. 6C).

Moreover, if necessary, the composition of the chlorine based gas may be changed.

After the resist layer 260 is peeled off by an ordinary method, a resist layer 265 having an aperture matched to the shape of a light shading film 230 to be made is formed on the light shading layer 230 (FIG. 6D), and with using the resist layer as an anti-etching mask, the light shading layer 230 is etched by a fluorine based gas.

The chromium oxide layer 220 serves as an etching stopper layer.

The resist layer 265 is, then, peeled off by an ordinary method to form a halftone phase shift photomask of the second embodiment (FIG. 6E).

As the resist to form the resist layer 265, one which is easily treatable, and has a desirable resolution and a high dry etching resistance is preferable, but it is not limited thereto.

As a modification of a halftone phase shift photomask of this embodiment, a phase shift photomask using a blank in each modification of the blank in the second embodiment shown in FIG. 2 mentioned previously can be cited.

These photomasks can be prepared by the manufacturing process shown in FIG. 6.

As persons skilled in the arts, it can be easily understood that many other modifications or alternations of the above mentioned embodiments of the photomask can be made within the scope and spirit of the present invention which are defined only by the annexed claims.

EXAMPLES

Now, the present invention will be illustrated more concretely by the following example.

This example is that a halftone phase shift photomask of the first embodiment shown in FIG. 3 is formed by a manufacturing method shown in FIG. 5 by using a blank for a halftone phase shift photomask in the first embodiment shown in FIG. 1.

In the following, this example will be explained to FIG. 1, FIG. 3 and FIG. 5.

The manufactured halftone phase shift photomask may be used in a process which includes exposing to ArF, in which a high purity synthetic quartz substrate of 6 inches square and 0.25 inch in thickness is used as a transparent substrate 110, a halftone phase shift film 120 comprising a two layer film having a tantalum layer 121 and a tantalum oxysilicide layer 122, and a light shielding layer 130 comprises a two layer film having a tantalum layer 131 and a tantalum oxide layer 132.

In the beginning, a blank for a halftone phase shift photomask in the first embodiment shown in FIG. 1 was manufactured as follows.

The tantalum layer 121, which is the first layer in a halftone phase shift film, was formed in the thickness of about 10 nm on the one surface of transparent substrate 110, which surface had been an optically polished and well rinsed in advance, under the following conditions.

The Forming Conditions of the Tantalum Layer

Film forming device: Planer type DC magnetron sputtering apparatus

| Target: | Tantalum metal |
|---|---|
| Gas and its flow rate: | Argon gas, 70 sccm |
| Sputtering pressure: | 1.0 Pa |
| Sputtering current: | 5.0 A |

Next, a tantalum oxysilicide film 122, which is the second layer in a halftone phase shift film, was formed in the thickness of about 30 nm on the tantalum layer under the following conditions.

The Forming Conditions of the Tantalum Oxysilicide Film 122

Film forming device: Planer type DC magnetron sputtering apparatus

| | |
|---|---|
| Target: | Tantalum :Silicon = 1:4 (Atomic ratio) |
| Gas and its flow rate: | Argon gas 50 sccm + Oxygen gas 50 sccm |
| Sputtering pressure: | 1.0 Pa |
| Sputtering current: | 3.5 A |

A halftone phase shift layer 120 of 6% in transmittance for exposing to ArF excimer laser was formed thereby on the one surface of the transparent substrate 110.

On the other hand, a sample having steps on its face, was prepared by a lift-off method where the film was formed under the same conditions onto a synthetic quartz substrate which had been masked with a tape and the like in advance and then the masking tape was peeled off to form the steps. Measurements with a commercially available phase difference measuring instrument (MPM193 made by Laser Tech. Co., Ltd.) showed that the phase difference and transmittance to the 193 nm light for this sample were 177.55 degree and 5.69%, respectively.

Next, the tantalum layer 131 in the light shading layer 130 was formed on the halftone phase shift layer 120 mentioned above under the following conditions.

The Forming Conditions of the Tantalum Layer 131

Film forming device: Planer type DC magnetron sputtering apparatus

| | |
|---|---|
| Target: | Tantalum metal |
| Gas and its flow rate: | Argon gas, 70 sccm |
| Sputtering pressure: | 1.0 Pa |
| Sputtering current: | 5.0 A |

The thickness of the tantalum metal film was made to be about 50 nm.

Then, the tantalum oxide layer 132 was formed on the tantalum layer 131 of the light shading layer 130 under the following conditions.

The Forming Conditions of the Tantalum Oxide Layer 132

Film forming device: Planer type DC magnetron sputtering apparatus

| | |
|---|---|
| Target: | Tantalum metal |
| Gas and its flow rate: | Argon gas 50 sccm + Oxygen gas 50 sccm |
| Sputtering pressure: | 1.0 Pa |
| Sputtering current: | 5.0 A |

The thickness of the tantalum oxide film was made to be about 20 nm.

Thus, a blank for a halftone phase shift photomask of the first embodiment shown in FIG. 1, which has a light shading film 130 and is for exposing to ArF excimer laser, was obtained.

When the transmittance of the blank for a halftone phase shift photomask with a light shading film 130 for exposing to ArF excimer laser was measured with a spectrophotometer MCPD 3000 made by Otsuka Denshi Co., Ltd., the transmittance of 193 nm light was 0.1% or less.

In the next place, by using the blank for the halftone phase shift mask with a light shading film 130 that was obtained as mentioned above, the halftone phase shift mask shown in FIG. 3 was manufactured in accordance to the following manner.

First, on the light shading film 130 of the obtained blank for the halftone phase shift mask, the resist layer 160 in the desired shape was prepared with using Resist ZEP 7000 (manufactured by Nippon Zeon Co., Ltd.) containing organic material as a main component and by the electron-beam lithography method (FIG. 5B).

Next, using a commercially available dry etcher (VLR 700 made by PTI Co., Ltd.) for a photomask, the exposed portions of the halftone phase shift layer 120, where the resist layer 160 was not existed, was exposed to a high density plasma in order to perform the selective dry etching for giving a predetermined pattern of the halftone phase shift layer 120 (FIG. 5C).

In this step, the light shading film 130 and the halftone phase shift layer 120 were continuously etched without any interval.

| <The etching conditions> | |
|---|---|
| Etching gas: | $CF_4$ gas |
| Pressure: | 10 mTorr |
| ICP power (High density plasma generation): | 950 W |
| Bias power (Drawing power): | 50 W |
| Time: | 500 seconds |

Then, the resist layer 160 was peeled off in order to obtain the pattern of the halftone phase shift layer 120 with the light shading film 130.

Next, Resist IP 3500 (made by Tokyo Ohka Kogyou Co., Ltd.) was applied again onto the resultant pattern and the resist layer thus obtained was subjected to photolithographic processing in order to obtain the processed resist layer 165 with apertures only in predetermined portions where the halftone film was exposed. The resultant was subjected to dry etching under the following conditions in order to remove the light shielding layer 130 selectively at the portions where the layer 130 being exposed through the apertures of resist layer 165 (FIG. 5D).

| | |
|---|---|
| Etching gas: | $Cl_2$ gas |
| Pressure: | 5 mTorr |
| ICP power (High density plasma generation): | 500 W |
| Bias power (Drawing power): | 150 W |
| Time: | 100 seconds |

Since the tantalum oxysilicide film 122 was not etched under this etching conditions, it was possible to remove the light shading film so that the phase difference and transmittance of the halftone phase shift layer 120 were not affected.

The tantalum oxysilicide film 122 served as an etching stopper.

Finally, the resist layer 165 was peeled off in order to obtain the halftone phase shift mask with the light shading film 130 shown in FIG. 3.

The halftone phase shift photomask of the present invention is practical for use at all points to provide dimensional accuracy of the removed parts, of the sectional shape, of the film thickness distribution, of the transmittance distribution, of the adhesion of the film to the substrate, and others.

In the case of manufacturing the a halftone phase shift photomask for using a step of exposing to ArF, as shown in FIG. 7A, a blank in which a tantalum layer and a tantalum oxysilicide layer as the halftone phase shift film, and a chromium layer and a chromium oxide layer as the light shading film, are superposed in this order on the one side of a transparent substrate as shown in FIG. 7B, would suffer from the same problem which can be seen in the manufacturing process of a halftone phase shift mask having the conventional light shading film as mentioned previously.

That is, a chromium light shading film should be dry etched with a chlorine based gas, while a tantalum silicide film should be dry etched with a fluorine based gas. Thus, the first dry etching step is necessary to be divided into the chlorine dry etching and the fluorine dry etching and which will cause a discontinuous works.

Therefore, when using one etching chamber, the first dry etching step has to take a gas replacing operation during its course, and which results in complexities of the process and the etching apparatus's construction as well as troublesome operations.

By using two etching chambers, it would be possible to modify the first etching step so that the dry etching of the light shading film in an etching chamber is followed by the transfer of the treated substrate from the chamber to another chamber in order to dry-etch the tantalum silicide in the latter chamber. However, the way also results in complexity of the etching apparatus's construction, and an enhancement in cost.

As mentioned above, the present invention made it possible to provide a halftone phase shift photomask with such a constitution that can be dry etched without using a complex process and an etching device with complex constitution.

At the same time, the present invention made it possible to provide a blank for a halftone phase shift photomask that makes such processing possible.

What is claimed is:

1. A blank for forming a halftone phase shift photomask which comprises a transparent substrate, a halftone phase shift layer and a substantial light shielding film, said halftone phase shift layer and said substantial light shielding film being layered on the transparent substrate, said substantial light shielding film being a single layered or multiple layered film which comprises a layer containing tantalum as a main ingredient, and said halftone phase shift layer is a single layered or multiple layered film which comprises a layer containing a tantalum silicide as a main component and further containing an element selected from the group consisting of oxygen, nitrogen and fluorine.

2. A blank for a halftone phase shift photomask which comprises a transparent substrate, a halftone phase shift layer and a substantial light shielding film, said halftone phase shift layer and said substantial light shielding film being layered on the transparent substrate, said substantial light shielding film being a single layered or multiple layered film which comprises a layer containing tantalum as a main ingredient and said halftone phase shift layer being a single layered or multiple layered film which comprises a layer containing chromium as a main component and further containing an element selected from the group consisting of oxygen, nitrogen and fluorine.

3. A blank for a halftone phase shift photomask according to claim 1 or claim 2, wherein a halftone phase shift layer is formed on a transparent substrate with having a phase difference φ within the range of nπ±π±3 radian (n is an odd number) according to the following equation:

$$\phi = \sum_{k=1}^{m-1} \times (k, k+1) + \sum_{k=2}^{m-1} 2\pi(u(k)-1)d(k)/\lambda$$

wherein, φ is a phase change caused to light vertically transmitting through the photomask in which a halftone phase shift layer with (m−2) layers is disposed on the transparent substrate, x(k, k+1) is a phase change occurring in the interface between a $k^{th}$ layer and a $(k+1)^{th}$ layer, u(k) and d(k) are the refractive index and film thickness of a material forming the $k^{th}$ layer, respectively, and λ is the wavelength of exposure light, providing that the layer of k=1 is the transparent substrate and the layer of k=m is air.

4. A blank for a halftone phase shift photomask according to claim 3, wherein a halftone phase shift layer is formed on the transparent substrate with having a film thickness which causes the transmittance of exposure light within the range of 1 to 50% when the transmittance of exposure light of the transparent substrate is defined as 100%.

5. A blank for a halftone phase shift photomask according to claim 1 or claim 2, wherein a halftone phase shift layer is formed on the transparent substrate with having a film thickness which causes the transmittance of exposure light within the range of 1 to 50% when the transmittance of exposure light of the transparent substrate is defined as 100%.

6. A halftone phase shift photomask which comprises a transparent substrate, a halftone phase shift layer and a substantial light shielding film, wherein said halftone phase shift layer and said substantial light shielding film being layered on the transparent substrate, said substantial light shielding film being a single layered or multiple layered film which comprises a layer containing tantalum as a main ingredient, and said halftone phase shift layer is a single layered or multiple layered film which comprises a layer containing a tantalum silicide as a main component and further containing an element selected from the group consisting of oxygen, nitrogen and fluorine.

7. A halftone phase shift photomask comprising a transparent substrate, a halftone phase shift layer and a substantial light shielding film, said halftone phase shift layer and said substantial light shielding film being layered on the transparent substrate, said substantial light shielding film being a single layered or multiple layered film which further comprises a layer containing tantalum as a main ingredient and said halftone phase shift layer being a single layered or multiple layered film which comprises a layer containing chromium as a main component and further containing an element selected from the group consisting of oxygen, nitrogen and fluorine.

8. A halftone phase shift photomask according to claim 6 or claim 7, wherein a halftone phase shift layer is formed on a transparent substrate having a phase difference φ within the range of nπ±π±3 radian (n is an odd number) according to the following equation:

$$\phi = \sum_{k=1}^{m-1} \times (k, k+1) + \sum_{k=2}^{m-1} 2\pi(u(k)-1)d(k)/\lambda$$

wherein, φ is a phase change caused to light vertically transmitting through the photomask in which a halftone phase shift layer with (m−2) layers is disposed on the transparent substrate, x(k, k+1) is a phase change occurring in the interface between the $k^{th}$ layer and the $(k+1)^{th}$ layer, u(k) and d(k) are the refractive index and film thickness respectively of a material forming the $k^{th}$ layer, and λ is the wavelength of the exposure light, providing that the layer of k+1 is the transparent substrate and the layer of k+1 is air.

9. A halftone phase shift photomask according to claim 8, wherein a halftone phase shift layer is formed on the transparent substrate with having a film thickness which causes the transmittance of exposure light within the range of 1 to 50% when the transmittance of exposure light of the transparent substrate is defined as 100%.

10. A halftone phase shift photomask according to claim 6 or claim 7, wherein a halftone phase shift layer is formed on the transparent substrate having a film thickness which causes the transmittance of the exposure light within the range of 1 to 50% when the transmittance of exposure light of the transparent substrate is defined as 100%.

* * * * *